United States Patent [19]
Gupta

[11] Patent Number: 5,341,979
[45] Date of Patent: Aug. 30, 1994

[54] METHOD OF BONDING A SEMICONDUCTOR SUBSTRATE TO A SUPPORT SUBSTRATE AND STRUCTURE THEREFORE

[75] Inventor: Debabrata Gupta, Scottsdale, Ariz.

[73] Assignee: Motorola, Inc., Schaumburg, Ill.

[21] Appl. No.: 115,616

[22] Filed: Sep. 3, 1993

[51] Int. Cl.$^5$ .......................................... H01L 21/607
[52] U.S. Cl. ............................... 228/111; 228/180.22; 228/254
[58] Field of Search ................... 228/110.1, 111, 111.5, 228/180.22, 56.3, 254; 427/123, 383.7

[56] References Cited

U.S. PATENT DOCUMENTS

| | | | |
|---|---|---|---|
| 3,657,790 | 4/1992 | Larrison | 228/4.1 |
| 4,878,611 | 11/1989 | Lo Vasco et al. | 228/180.22 |
| 5,001,545 | 3/1991 | Kalfus et al. | 437/220 |
| 5,148,968 | 9/1992 | Schmidt et al. | 228/180.22 |
| 5,154,341 | 10/1992 | Melton et al. | 228/180.22 |
| 5,162,264 | 11/1992 | Haug et al. | 437/209 |
| 5,218,234 | 6/1993 | Thompson et al. | 257/787 |

*Primary Examiner*—Samuel M. Heinrich
*Attorney, Agent, or Firm*—Rennie William Dover

[57] ABSTRACT

A method and means of bonding a semiconductor die (10) to a support substrate (35) using a thermosonic bonding apparatus (50). The semiconductor die (10) has bonding pads (14, 15, 17) on a first major surface (12), and the support substrate (35) has contact pads (46, 47, 44) on a principal surface (43). Hourglass shaped gold bumps (30) are formed on bonding pads (14, 15, 17). A second major surface (13) of semiconductor die (10) is secured to a thermosonic tool/end-effector (52), and the support substrate (35) is secured to a substrate chuck (48). The hourglass shaped gold bumps (30) are mated with the contact pads (46, 47, 44) on the support substrate (35). A bond is thermosonically formed between the gold bumps (30) and the contact pads (46, 47, 44).

15 Claims, 3 Drawing Sheets

METHOD OF BONDING A SEMICONDUCTOR SUBSTRATE TO A SUPPORT SUBSTRATE AND STRUCTURE THEREFORE

BACKGROUND OF THE INVENTION

The present invention relates, in general, to bonding substrates together, and more particularly, to methods and means for bonding a semiconductor substrate to a support substrate.

An important step in manufacturing semiconductor devices is electrically connecting circuit components in a semiconductor substrate to support substrates such as printed circuit boards, leadframes, or the like. Techniques for forming these electrical connections include wirebonding, tape automated bonding (TAB), and flip-chip bonding. In wirebonding, the semiconductor substrate is typically separated into individual semiconductor die which are mounted to a support substrate such as a printed circuit board. Then, wirebonds are formed between bonding pads on the semiconductor die and corresponding contact pads on the support substrate. Wirebonding techniques are well known and are discussed in, for example, U.S. Pat. No. 5,001,545 issued to Kalfus et al. on Mar. 19, 1991.

In conventional flip-chip bonding, round or hemispheroidal solder bumps are formed on the semiconductor substrate bonding pads. Subsequently, the round or hemispheroidal solder bumps are mated with corresponding bonding pads on a support substrate such as a printed circuit board. Flip-chip bumps and bonding techniques are well known and discussed in for example, U.S. Pat. No. 5,218,234 issued to Thompson et al. on Jun. 8, 1993.

Although wirebonding and conventional flip-chip bonding are useful techniques, each technique has inherent drawbacks. For example, wirebonding to power semiconductor devices built in gallium arsenide (GaAs) wafers requires the GaAs wafers to be thin because they are poor thermal conductors. However, thin GaAs wafers are undesirable because they are brittle and have increased susceptibility to breakage. Further, thinning processes for GaAs wafers creates toxic by-products.

The round or hemispheroidal solder bumps used in flip-chip bonding, on the other hand, form bonds having high stress regions at the interface of the bump and the support substrate, which tends to weaken these bonds. Thermal expansion or contraction of either the semiconductor die or the support substrate further weakens the bond at the high stress region, and may cause the bond to break due to thermal fatigue.

Another drawback to prior art wirebonding and flip-chip bonding techniques is that heat removal from the semiconductor die is accomplished by mounting a heat-sink to the backside of the semiconductor die, thereby requiring additional processing steps.

Accordingly, it would be advantageous to have a method and structure of bonding two substrates, wherein the bond is less susceptible to damage caused by stresses associated with the expansion and contraction of the substrates. Further, the method should permit bump formation over active areas of the semiconductor substrate. Moreover, it is desirable for the structure to promote heat removal from a front side of the semiconductor die.

SUMMARY OF THE INVENTION

Briefly stated, the present invention is a method of attaching a first substrate to a second substrate. The method comprises providing a first substrate having a first major surface, a second major surface, and a conductive layer disposed on at least a portion of the first major surface. The second substrate has at least one contact structure, and comprises a metallic pedestal mounted on a base plate and a dielectric material surrounding a portion of the metallic pedestal. Another step includes photolithographically forming at least one hourglass shaped metallic bump on a portion of the conductive layer. Subsequently, the method entails thermosonically bonding the hourglass shaped metallic bump to the at least one contact structure.

Another aspect of the present invention includes a semiconductor substrate having a first major surface and a second major surface. A conductive layer is formed on the first major surface and an hourglass shaped metallic bump is formed on the conductive layer.

DETAILED DESCRIPTION OF THE DRAWING

Figure 1:
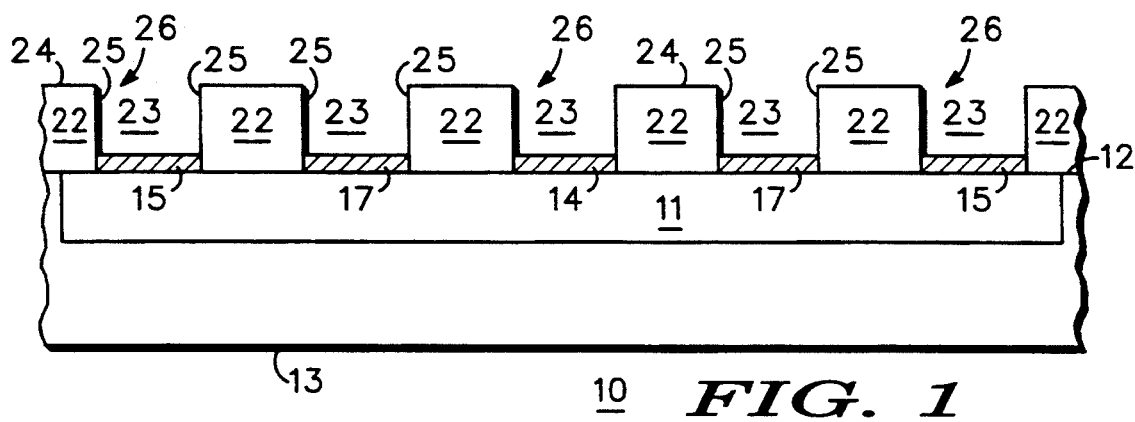
FIGS. 1-4 illustrate highly enlarged cross-sectional views of a portion of an embodiment of the present invention in progressive stages of manufacture.

The present invention discloses a method and means of bonding a semiconductor substrate such as a semiconductor die to a support substrate. In a preferred embodiment, the method includes forming hourglass shaped metallic bumps on the semiconductor substrate and thermosonically bonding the hourglass shaped metallic bumps to the support substrate. FIGS. 1-4 illustrate highly enlarged cross-sectional views of the formation of the hourglass shaped metallic bumps in progressive stages of manufacture, and in accordance with the present invention, i.e., photolithographically forming an hourglass shaped metallic bump on a conductive layer. It shall be understood that the same reference numerals are used in the figures to denote the same elements.

Figure 4:
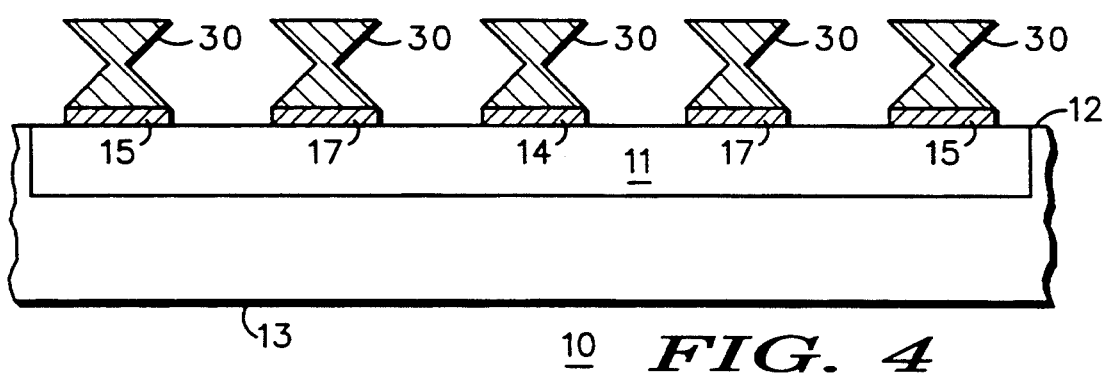

FIG. 1 illustrates an enlarged cross-sectional view of a portion of a semiconductor wafer 10 a stage in the formation of a metallic bump (reference numeral 30 of FIG. 4). More particularly, the portion of the semiconductor wafer is a portion of a semiconductor die 10 which is formed from a semiconductor substrate such as gallium arsenide, silicon, germanium, indium phosphide, or the like. Semiconductor die 10 generally includes an active semiconductor device 11, which may be a metal oxide semiconductor field effect transistor (MOSFET), a junction field effect transistor (JFET), a bipolar junction transistor (BJT), etc. By way of example, semiconductor die 10 is gallium arsenide having a thickness of less than approximately 525 micrometers, and active semiconductor device 11 is a MOSFET.

In the embodiment shown in FIG. 1, semiconductor die 10 has a front side or first major surface 12 having a drain bonding pad 14 and source bonding pads 15 formed thereon. Semiconductor die 10 also has a back side or second major surface 13. Although bonding pads 14 and 15 are shown as a single layer of conductive material, it shall be understood that bonding pads 14 and 15 may be comprised of one or more layers. By way of example, drain and source bonding pads 14 and 15, respectively, are multi-layer structures comprising nickel, germanium, tungsten, nickel, and gold, wherein the layer of nickel contacts major surface 12. Bonding pads 14 and 15 serve as drain and source electrodes, respectively, and are electrically isolated from one another.

In addition, gate bonding pads or electrodes 17 are formed on major surface 12, wherein gate electrodes 17 are electrically isolated from electrodes 14 and 15. In accordance with the above-mentioned example, gate electrodes 17 are aluminum or an aluminum alloy. Hereinafter, the word aluminum will be used to refer to either aluminum or an aluminum alloy. Although aluminum is the preferred material for gate electrodes 17, it shall be understood that similar metals having good conductive properties may be used in place of aluminum. Methods of fabricating semiconductor devices, such as MOSFET's having bonding pads, are well known in the art.

Electrodes 14, 15, 17, and portions of first major surface 12 are coated or covered by a first layer of photoresist 22. Openings or cavities 23 are formed in first layer of photoresist 22, wherein openings 23 are above electrodes 14, 15, and 17 and extend from a top surface 24 of first layer of photoresist 22 to electrodes 14, 15, and 17, thereby exposing these electrodes. Preferably openings 23 have sidewalls 25 that are substantially perpendicular to top surface 24. In addition, openings 23 have entrances or mouths 26. Techniques for forming openings in layers of photoresist are well known to those skilled in the art.

Figure 2:
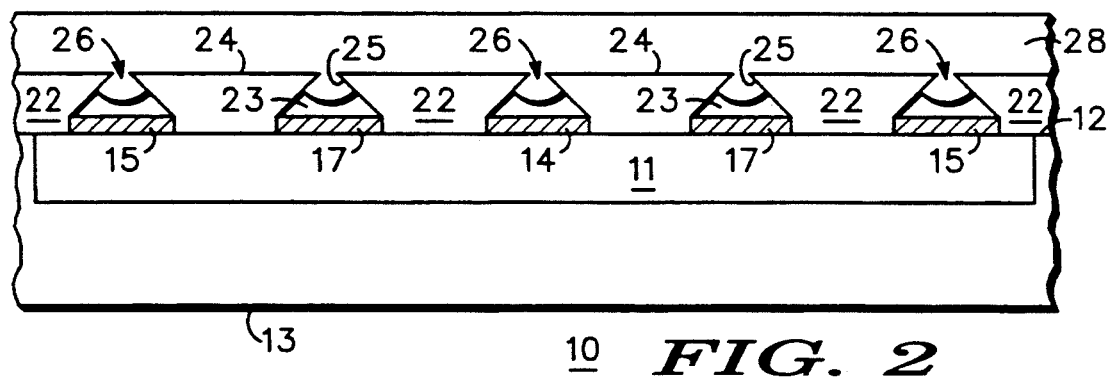

Referring now to FIG. 2, first layer of photoresist 22 is partially liquefied or fluidized so that a top portion of edges 25 flows, thereby narrowing mouths 26 of openings 23. In other words, the portions of edges 25 proximal to top surface 24 become fluid and flow, thereby narrowing openings 23 at their mouths. In a preferred embodiment, first layer of photoresist 22 is partially fluidized by placing semiconductor die 10 under a heat source such that the heat source heats top surface 24, thereby causing top surface 24 to become fluid or liquefy while the portion of first layer of photoresist 22 proximal to first major surface 12 remains in a solid state.

Semiconductor die 10 is removed from under the heat source before opening 23 becomes closed at mouth 26, and before the portion of first layer of photoresist 22 proximal to passivating layer 13 becomes fluidized. By way of example, semiconductor die 10 is placed in an oven at a temperature ranging between approximately 120° C. and approximately 150° C. for approximately 10 minutes, wherein the oven provides heat to top surface 24. After mouth 26 is narrowed, semiconductor die 10 is removed from the oven. Although opening 23 appears to have a triangular shape in FIG. 2, it shall be understood that FIG. 2 is a two dimensional representation of semiconductor die 10. Thus, openings 23 are pyramidally shaped structures that lack tops or apices. By way of example, openings 23 may have a base that is approximately 16 micrometers ($\mu$m) square, a mouth that is approximately 13 $\mu$m square, and a height ranging between approximately 12 $\mu$m and approximately 20 $\mu$m.

Next, first layer of photoresist 22 is coated with a second layer of photoresist 28, wherein second layer of photoresist 28 partially fills openings 23, i.e., second layer of photoresist 28 fills the narrowed mouths of openings 23, thereby closing openings 23. Due to the sizes of mouths 26 and the viscosity of the photoresist, second layer of photoresist 28 only partially fills openings 23, i.e., second layer of photoresist 28 does not contact electrodes 14, 15, and 17. Thus, second layer of photoresist 28 is spaced apart from electrodes 14, 15, and 17 in openings 23.

Figure 3:
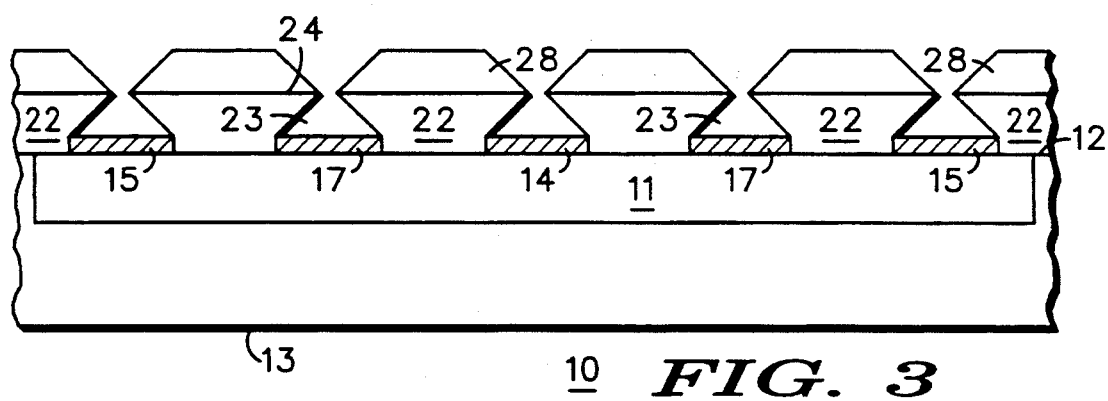

Referring now to FIG. 3, second layer of photoresist 28 over electrodes 14, 15, and 17 is nonuniformly exposed to light and openings 23 are re-opened. More particularly, the light impinging on second layer of photoresist 28 interacts with second layer of photoresist 28 producing a shallow Gaussian shape when second layer of photoresist 28 is developed. More particularly, second layer of photoresist 28 is exposed to ultraviolet light and subsequently developed. The pattern formed in second layer of photoresist 28 is in the shape of a shallow Gaussian profile or shape. Further, the combination of the exposure and development of first and second layers of photoresist 22 and 28, respectively, cooperate to provide re-opened openings 23 with an hourglass shape, i.e., portions of second layer of photoresist 28 and the first layer of photoresist 22 above the portion of the conductive layer previously exposed are removed such that an hourglass shaped contact opening is formed.

Referring now to FIG. 4, openings 23 are filled with an electrically conductive material such as, for example, gold, thereby forming gold bumps 30. Techniques for filling openings 23 with an electrically conductive material are well known to those skilled in the art. A suitable technique for filling openings 23 with gold is by electroplating the gold onto electrodes 14, 15, and 17 such that the gold fills hourglass shaped openings 23. After filling openings 23 with gold, second layer of photoresist 28 and first layer of photoresist 22 are removed, leaving gold bumps 30 on electrodes 14, 15, and 17, wherein gold bumps 30 have an hourglass shape.

Figure 5:
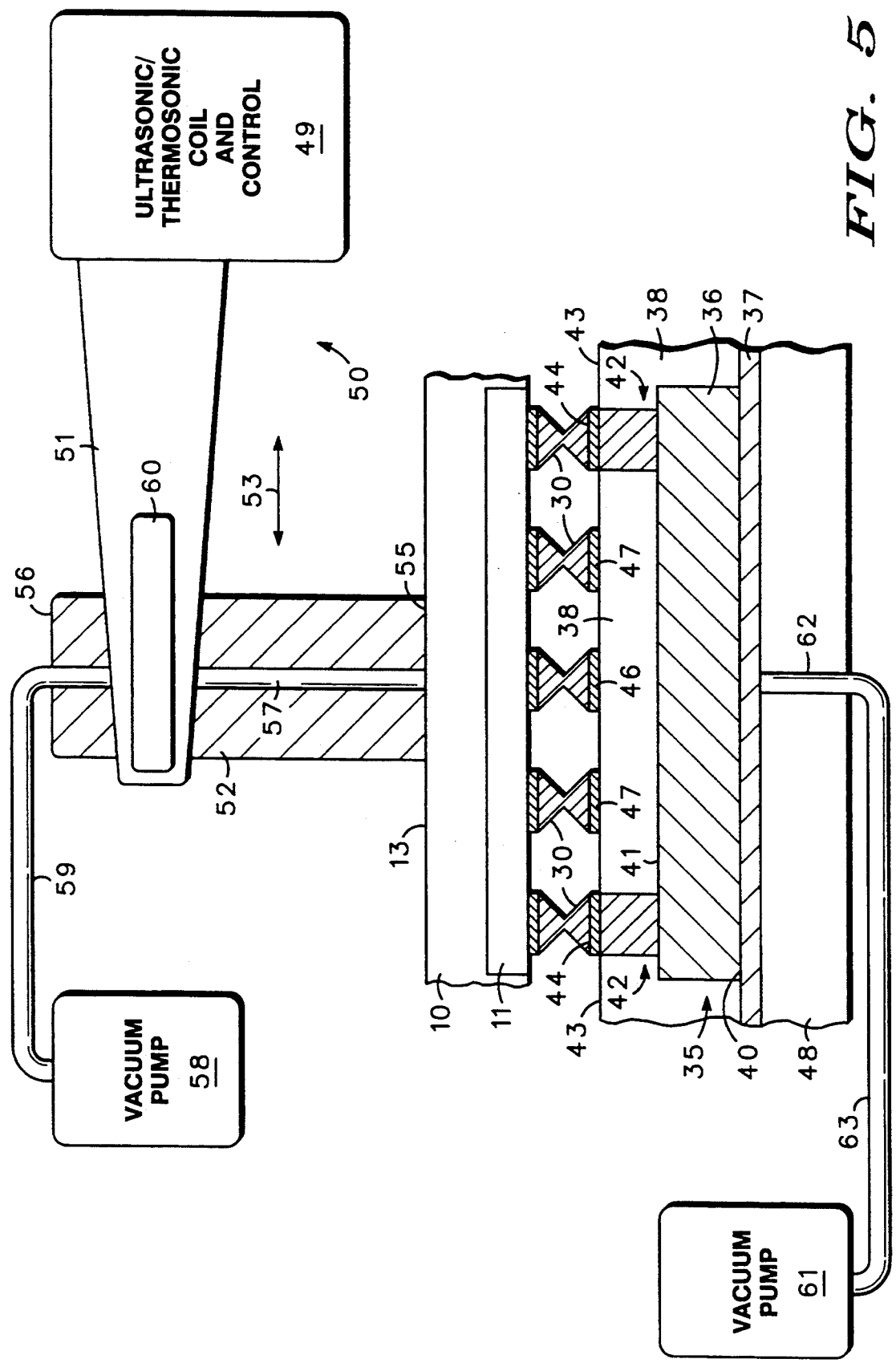
FIG. 5 illustrates a semiconductor die and a first embodiment of a support substrate secured to a thermosonic flip-chip bonding apparatus in accordance with the present invention.

FIG. 5 illustrates the flipped semiconductor die 10 having gold bumps 30 (FIG. 4) secured to a thermosonic flip-chip bonding apparatus 50, also referred to as a thermosonic flip-chip bonder. More particularly, FIG. 5 shows an ultrasonic/thermosonic coil and control 49 of thermosonic flip-chip bonding apparatus 50 having a thermosonic horn 51 extending therefrom. Thermosonic horn 51 is a cantilever structure that extends from thermosonic bonding apparatus 50. A heating coil 60 is mounted to an end of thermosonic horn 51. Thermosonic flip-chip bonding apparatus 50 having a thermosonic horn 51 is known to those skilled in the art.

FIG. 5 further shows a cross-sectional view of a thermosonic tool/end-effector 52, wherein thermosonic tool/end-effector 52 is mounted to an end of thermosonic horn 51. Thermosonic tool/end-effector 52 is a cylindrically shaped structure having a first end 55 and a second end 56 that couples a portion of semiconductor die 10 to thermosonic horn 51. A vacuum duct 57 extends from first end 55, along a longitudinal axis of thermosonic tool/end-effector 52, terminating at second end 56. A vacuum pump 58 is coupled to second end 56 by a vacuum line 59. By way of example, thermosonic tool/end-effector 52 is made from tool steel and a vacuum duct 57 has a diameter of approximately 0.25 millimeters. Further, heat from heating coil 60 is transferred along thermosonic tool/end-effector 52 to first end 55.

A support substrate 35 comprises a conductive slug or metallic pedestal 36 mounted to a base plate 37, and a dielectric material 38 surrounding a portion of metallic pedestal 36. It shall be understood that metallic pedestal 36 has a first major surface 41, a second major surface 40, and is both thermally and electrically conductive. More particularly, a second major surface 40 of metallic pedestal 36 is bonded to base plate 37. Dielectric material 38 has two vias 42 which expose a portion of first major surface 41, wherein vias 42 are filled with a conductive material. In the embodiment shown in FIG. 5, vias 42 are metal filled vias which extend from first major surface 41 of metallic pedestal 36 to a top or principal surface 43 of dielectric material 38, wherein ends 44 of metal filled vias 42 serve as a source contact structures, i.e., source contact pads. In addition, a drain contact structure or pad 46 and gate contact structures or pads 47 are formed on top surface 43. Drain electrode 14 is positioned to correspond to contact pads 44 and gate electrodes 17 are positioned to correspond to contact pads 47. By way of example, metallic pedestal 36 is copper, base plate 37 is an alloy of copper and nickel, dielectric material 38 is bismaleimide-triazine resin, and the metal filling vias 42 and forming contact pads 46 and 47 is copper. Preferably, the copper of metal filled vias 42 is formed by electroplating or electrodeposition. An advantage of forming support substrate 35 with a metallic pedestal 36 and subsequently forming a second metal layer in the form of metal filled vias 42 is that top surface 43 of support substrate 35 is sufficiently planar to permit flip-chip bonding of semiconductor die 10 to support substrate 35.

Semiconductor die 10 is temporarily secured to thermosonic tool/end-effector 52 by placing backside 13 of semiconductor die 10 in contact with first end 55 and enabling vacuum pump 58. Subsequently, heat from heating coil 60 travels to first end 55. Moreover, base plate 37 of support substrate 35 is attached to a substrate chuck 48 which is heated by a heater (not shown). Suitable temperatures for heating the first end 55 and the substrate chuck 48 are less than approximately 180° C. Methods for attaching support substrate 35 to substrate chuck 48 are well known to those skilled in the art. For example, a vacuum pump 61 may be coupled to a vacuum port 62 by means of a vacuum line 63. As those skilled in the art will appreciate, support substrate 35 is secured to substrate chuck 48 by placing support substrate 35 on substrate chuck 48 and enabling vacuum pump 61. Subsequently, thermosonic tool/end-effector 52 is positioned so that hourglass shaped gold bumps 30 formed on drain electrode 14, source electrodes 15, and gate electrodes 17 contact their respective contact pads 46, 44, and 47 on support substrate 35.

By way of example, a thermosonic bond is formed between electrodes 14, 15, and 17 and their respective contact pads 46, 44, and 47 on support substrate 35 by configuring thermosonic tool/end-effector 52 such that thermosonic tool/end-effector 52 applies a force on backside 13 equivalent to a mass ranging between approximately 50 grams and approximately 1,500 grams being applied to hourglass shaped bumps 30. Simultaneously, thermosonic tool/end-effector 52 is moved or agitated in a direction parallel to backside 13 and in a reciprocating fashion (indicated by arrows 53) at a frequency ranging between approximately 50 kilohertz and approximately 120 kilohertz. Further, thermosonic tool/end-effector 52 moves through a distance ranging between approximately 0.2 micrometers and approximately 2 micrometers for a time ranging between approximately 0.1 and approximately 3 seconds. Thus, semiconductor die 10 is moved in a direction substantially parallel to first major surface 12 of semiconductor die 10. After the thermosonic bond is formed, vacuum pumps 58 and 61 are disabled, semiconductor die 10 is detached from thermosonic tool/end-effector 52, and support substrate 35 is detached from the substrate chuck 48. In other words the semiconductor die 10 is decoupled from the thermosonic horn 51.

In the embodiment of FIG. 5, source contact pad 44 is coupled to base plate 37 through metallic pedestal 36 and metal filled vias 42. Further, base plate 37 may be set at a desired electric potential, thereby setting the source of the MOSFET at the desired electrical potential. More particularly, applying a ground potential (i.e., zero volts) to base plate 37 serves to ground the source of the MOSFET.

Figure 6:
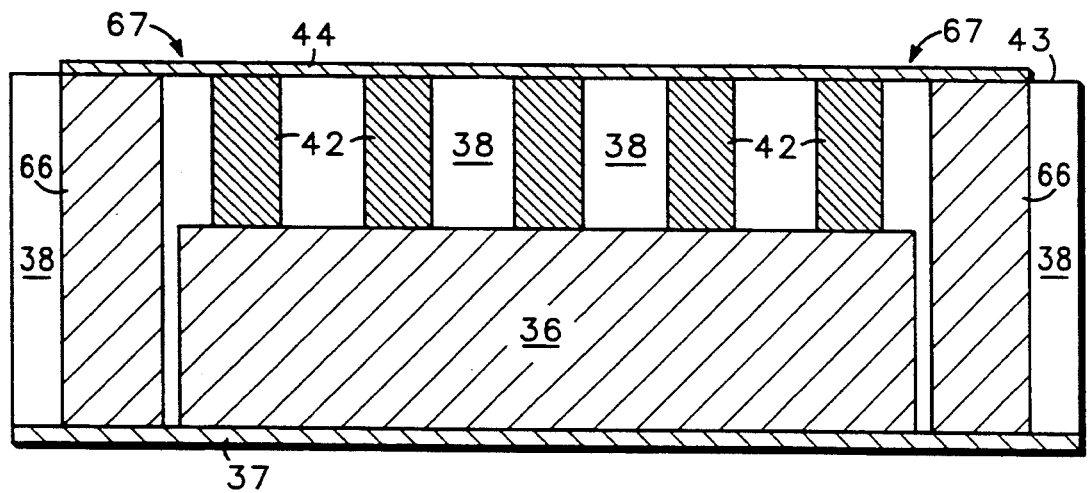
FIG. 6 illustrates a second embodiment of a support substrate in accordance with the present invention.

FIG. 6 illustrates a second embodiment of a support substrate 65. A metallic pedestal 36 is bonded to a base plate 37. Further, a dielectric material 38 having a top surface 43 surrounds metallic pedestal 36 and has metal filled vias 42 extending from top surface 43 to metallic pedestal 36. A source contact layer 44 is coupled to metallic pedestal 36 by metal filled vias 42. In the second embodiment, metal filled thermal vias 66 are formed adjacent to and spaced apart from metallic pedestal 36. By way of example, metal filled thermal vias 66 are filled with copper, which may be formed by electroplating. Although metal filled thermal vias 66 are shown as being coupled to source contact layer 44 by metal strips 67, it shall be understood that this is not a limitation of the second embodiment. In other words metal strips 67 may be absent.

Figure 7:
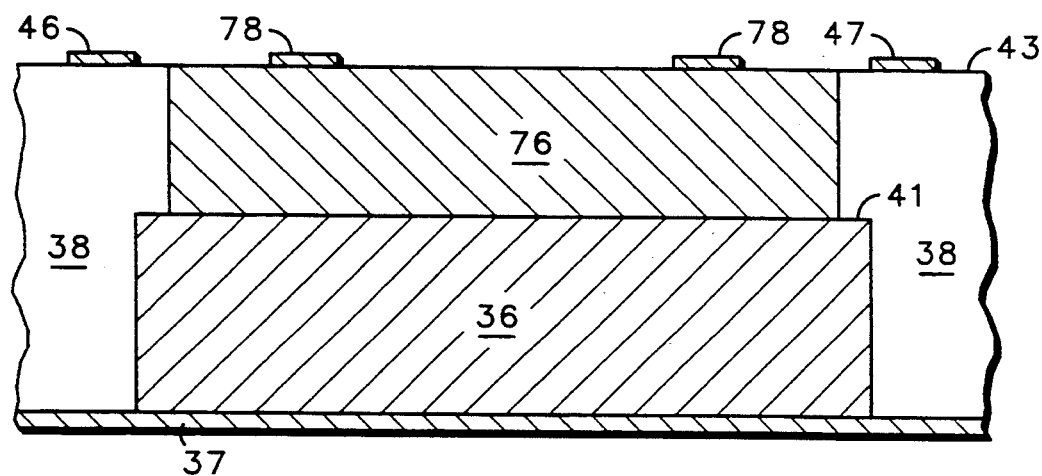
FIG. 7 illustrates a third embodiment of a support substrate in accordance with the present invention.

FIG. 7 illustrates a third embodiment of a support substrate 75. Similar to the embodiments of FIGS. 5 and 6, support substrate 75 comprises a conductive slug or metallic pedestal 36 mounted to a base plate 37, wherein metallic pedestal 36 has a first major surface 41. A dielectric material 38 having a top surface 43 surrounds a portion of metallic pedestal 36. In the third embodiment, a single metal filled cavity 76 extends from first major surface 41 of metallic pedestal 36 to a top surface 43 of dielectric material 38. Preferably the metal of metal filled cavity 76 is copper. Metal filled cavity 76 may be formed using techniques well known to those skilled in the art, such as electroplating or electrodeposition techniques. Source contact pads 78 are formed on the metal of metal filled cavity 76.

Figure 8:
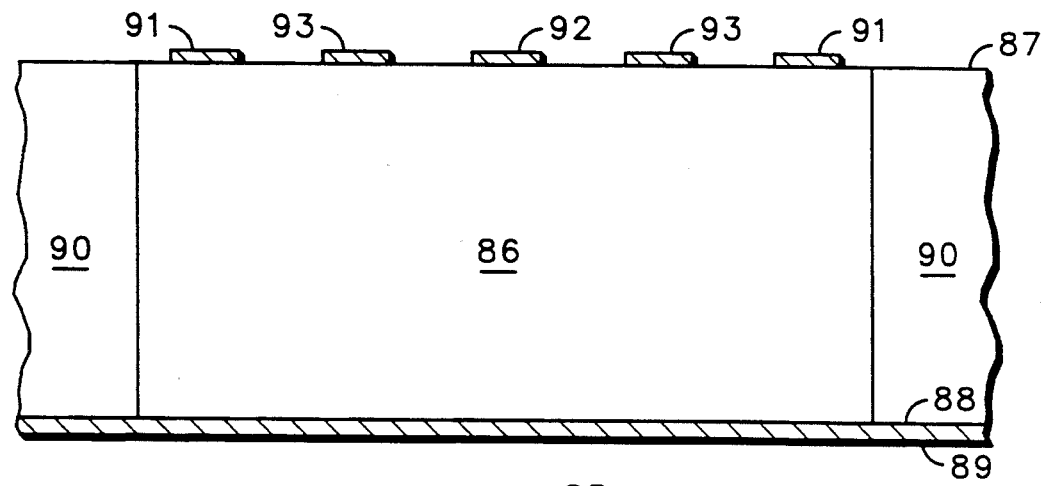
FIG. 8 illustrates a fourth embodiment of a support substrate in accordance with the present invention.

FIG. 8 illustrates a fourth embodiment of a support substrate 85. In the fourth embodiment, a pedestal 86 having a first major surface 87 and a second major surface 88 is formed from aluminum-nitride. Second major surface 88 is bonded to a base plate 89. Subsequently, pedestal 86 is encapsulated by a dielectric material 90 such as, for example, a bismaleimide-triazine resin. An opening is formed in dielectric material 90 exposing a portion of first major surface 87. A layer of conductive material is patterned over the exposed portion of first major surface 87. More particularly, source contact pads 91, a drain contact pad 92, and gate contact pads 93 are formed on first major surface 87. Methods of forming openings in a dielectric material and forming contact pads on aluminum nitride are well known to those skilled in the art. As is obvious to those skilled in the art, the pedestal 86 may be formed from other suitable materials such as, for example, beryllium oxide.

By now it should be appreciated that a novel method and means for bonding two substrates together has been provided. The method includes photolithographically forming hourglass shaped bumps on an electrically conductive layer disposed on at least a portion of a major surface of a semiconductor substrate. Although the bumps have been described as being formed on a semiconductor substrate, those skilled in the art will understand that the hourglass shaped bumps can be formed on a support substrate.

An advantage of bumps having an hourglass shape is that a region of maximum stress due to thermal expansion of the semiconductor die or a coefficient of thermal expansion of the support substrate to which the semiconductor die is bonded occurs at the central or the narrowest portion of the bump. In conventional bumps, the maximum stress occurs at the interface of the bump and the semiconductor die or the support substrate. In other words, in conventional bumps the interface between the semiconductor die and the support substrate has an acute angle which decreases the bonding area between the bump and the semiconductor die or the support substrate, and expansion of the semiconductor die or the support substrate creates a maximum stress at these locations.

Further, hourglass shaped bumps provide a larger surface area for bonding with the semiconductor die, thereby decreasing the mechanical stresses on the semiconductor die due to the bump. The decrease in these mechanical stresses allows placement of the hourglass shaped bumps over active areas of a semiconductor substrate, i.e., over regions in which semiconductor devices are manufactured.

Another feature of the present invention is the use of thermosonic flip-chip bonding to bond two substrates together. The thermosonic flip-chip bonding of the present invention is performed at temperatures less than or equal to approximately 180° C., which is lower than the nominal temperatures used in thermocompression flip-chip bonding, i.e., temperatures of approximately 330° C. In particular, the present invention allows thermosonically flip-chip bonding a brittle piezoresistive substrate such as, for example, gallium arsenide to a support substrate. In addition, flip-chip bonding enables removal of heat from a gallium arsenide semiconductor die from its front or active side or surface.

Other modifications and variations will be apparent to those skilled in the art and it is intended to encompass all such variations and modifications within the broad scope of the invention.

I claim:

1. A method of bonding a semiconductor substrate to a support substrate, comprising the steps of: providing the support substrate, wherein the support substrate has a first principal surface and at least one contact structure on the first principal surface;
    providing the semiconductor substrate, wherein the semiconductor substrate has a first major surface, a second major surface, and at least one bonding pad on the first major surface, the at least one bonding pad corresponding to the at least one contact structure; covering the at least one bonding pad and a portion of the first major surface with a first layer of photoresist;
    forming an opening in the first layer of photoresist, wherein the opening has a mouth and exposes the at least one bonding pad; narrowing the mouth of the opening;
    coating the first layer of photoresist with a second layer of photoresist, wherein coating the first layer of photoresist fills the narrowed mouth of the opening;
    re-opening the opening, wherein the reopened opening has an hourglass shape;
    filling the hourglass shaped opening with an electrically conductive material;
    removing the first and the second layers of photoresist, wherein an hourglass shaped bump is formed on the at least one bonding pad; and
    bonding the electrically conductive material filling the hourglass shaped opening to the at least one contact structure.

2. A method of bonding a semiconductor substrate to a support substrate as claimed in claim 1, wherein the step of narrowing the mouth of the opening includes partially liquefying a portion of the first layer of photoresist.

3. A method of bonding a semiconductor substrate to a support substrate as claimed in claim 1, wherein the step of narrowing the mouth of the opening includes heating a top surface of the first layer of photoresist.

4. A method of bonding a semiconductor substrate to a support substrate as claimed in claim 1, wherein the step of filling the hourglass shaped opening with an electrically conductive material includes using gold as the electrically conductive material, wherein the gold acquires the hourglass shape of the opening.

5. A method of bonding a semiconductor substrate to a support substrate as claimed in claim 1, wherein the step of providing the support substrate includes the steps of:
    providing a base plate;
    providing a conductive slug, the conductive slug having a first major surface, a second major surface, and being thermally and electrically conductive;
    mounting the conductive slug to the base plate, wherein the second major surface of the conductive slug is bonded to the base plate;
    surrounding the conductive slug with a dielectric material;
    forming at least one via through the dielectric material, wherein the at least one via exposes a portion of the first major surface of the conductive slug; and
    filling the at least one via with a conductive material.

6. A method of bonding a semiconductor substrate to a support substrate as claimed in claim 1, further including thermosonically bonding the electrically conductive material filling the hourglass shaped opening to the at least one contact structure.

7. A method of bonding a semiconductor substrate to a support substrate as claimed in claim 6, wherein the step of bonding the electrically conductive material includes:
    providing a thermosonic flip-chip bonder, wherein the thermosonic flip-chip bonder has a thermosonic horn;

mounting a thermosonic tool/end-effector to the thermosonic horn;

temporarily securing a portion of the second major surface of the semiconductor substrate to the thermosonic tool/end-effector;

placing the hourglass shaped bump on the at least one bonding pad in contact with the at least one contact structure;

moving the thermosonic tool/end-effector in a direction parallel to the second major surface of the portion of the semiconductor substrate; and separating the portion of the second major surface of the semiconductor substrate from the thermosonic tool/end-effector.

8. A method of attaching a first substrate to a second substrate, comprising the steps of:

providing the first substrate, wherein the first substrate has a first major surface, a second major surface, and an electrically conductive layer on at least a portion of the first major surface;

photolithographically forming at least one hourglass shaped metallic bump on a portion of the electrically conductive layer;

providing the second substrate, wherein the second substrate includes at least one contact structure having a principal surface, and comprises a base plate having a metallic pedestal mounted thereon and a dielectric material surrounding a portion of the metallic pedestal; and thermosonically bonding the hourglass shaped metallic bump to the at least one contact structure.

9. A method of attaching a first substrate to a second substrate as claimed in claim 8, further including selecting the first substrate from the group consisting of gallium arsenide, silicon, germanium, or indium phosphide.

10. A method of attaching a first substrate to a second substrate as claimed in claim 8, wherein the step of photolithographically forming at least one hourglass shaped metallic bump on a portion of the electrically conductive layer further comprises:

forming a first layer of photoresist over the first major surface of the first substrate and on the electrically conductive layer;

forming an opening in the first layer of photoresist, the opening exposing a portion of the electrically conductive layer;

partially fluidizing the first layer of photoresist;

covering the first layer of photoresist with a second layer of photoresist;

removing a portion of the second layer of photoresist and the first layer of photoresist above the portion of the electrically conductive layer previously exposed such that an hourglass shaped contact opening is formed;

filling the hourglass shaped contact opening with a conductive material; and removing a remaining portion of the first and the second layers of photoresist.

11. A method of attaching a first substrate to a second substrate as claimed in claim 10, wherein the step of forming an opening in the first layer of photoresist includes forming a cavity in a portion of the first layer of photoresist above the bonding pad region, the cavity having an entrance.

12. A method of attaching a first substrate to a second substrate as claimed in claim 11, wherein the step of partially fluidizing the first layer of photoresist includes heating the first layer of photoresist from a top surface such that the top surface flows and narrows the entrance.

13. A method of attaching a first substrate to a second substrate as claimed in claim 10, includes filling the at least one hourglass shaped contact opening by electroplating a metal in the at least one hourglass shaped contact opening.

14. A method of attaching a first substrate to a second substrate as claimed in claim 10, wherein the step of filling the at least one hourglass shaped contact opening with a conductive material includes forming the at least one hourglass shaped contact opening from gold.

15. A method of attaching a first substrate to a second substrate as claimed in claim 8, wherein the step of thermosonically bonding the hourglass shaped metallic bump to the at least one contact structure further comprises:

providing a thermosonic flip-chip bonder, wherein the thermosonic flip-chip bonder has a thermosonic horn;

coupling the first substrate to the thermosonic horn;

contacting the at least one hourglass shaped metallic bump with the at least one contact structure, wherein a mass ranging between approximately 50 grams and 1,500 grams is applied to the hourglass shaped bump;

moving the first substrate in a direction substantially parallel to the first major surface;

decoupling the first substrate from the thermosonic horn.

* * * * *